(12) United States Patent
Choy

(10) Patent No.: US 9,627,964 B1
(45) Date of Patent: Apr. 18, 2017

(54) SYSTEMS AND METHODS FOR RECOVERING VOLTAGE BEYOND DEVICE LIMITS

(71) Applicant: FREESCALE SEMICONDUCTOR, INC., Austin, TX (US)

(72) Inventor: Jon Choy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/053,002

(22) Filed: Feb. 25, 2016

(51) Int. Cl.
*H02M 3/00* (2006.01)
*H02M 3/07* (2006.01)

(52) U.S. Cl.
CPC ..................... *H02M 3/07* (2013.01)

(58) Field of Classification Search
CPC ......... H02M 3/00; H02M 3/076; H02M 3/157
See application file for complete search history.

(56) References Cited

U.S. PATENT DOCUMENTS

| | | | | |
|---|---|---|---|---|
| 5,537,072 A | * | 7/1996 | Canclini | H03K 17/063 327/13 |
| 6,477,091 B2 | | 11/2002 | Tedrow et al. | |
| 7,046,040 B2 | | 5/2006 | Guedon | |
| 7,612,605 B2 | * | 11/2009 | Chou | G11O 5/147 327/536 |
| 8,797,092 B2 | * | 8/2014 | De Sandre | G11O 5/145 327/536 |

* cited by examiner

*Primary Examiner* — Hai L Nguyen

(57) ABSTRACT

A voltage recovery circuit in an integrated circuit is provided. The voltage recovery circuit includes a bootstrap circuit coupled to a cascode switch circuit. The bootstrap circuit includes a first transistor coupled in series to a second transistor, a resistive element is coupled between the second transistor and an output of the voltage recovery circuit, and a capacitive element is coupled between control electrodes of the first and second transistors and the output. The cascode switch circuit includes a third and fourth transistor coupled in series. The third transistor includes a current electrode coupled to receive a first input voltage, and a control electrode coupled to the control electrodes of the first and second transistors. The fourth transistor includes a current electrode coupled to the output, and a control electrode coupled to a current electrode of the second transistor and a terminal of the resistive element.

20 Claims, 5 Drawing Sheets

SYSTEMS AND METHODS FOR RECOVERING VOLTAGE BEYOND DEVICE LIMITS

BACKGROUND

Field

This disclosure relates generally to semiconductor devices, and more specifically, to recovering voltage beyond device voltage limits.

Related Art

Devices that operate in ultra-low power modes can be subjected to a high amount of back bias and sometimes voltages greater than oxides in the devices are designed to handle. For example, a back bias of −3 Volts may be required on a 0.9 Volt core device in a silicon on insulator (SOI) technology. In some thin film memory designs, as another example, a 14 Volt supply is required during erase even though oxide in the devices can only handle 9 volts. During a brown-out, it is desirable to recover bias voltages quickly to avoid damaging the devices. Recovering nodes with relatively large capacitance (e.g. nanoFarad) at these levels relatively quickly can pose a problem yet are required for fast wakeup, especially when the voltages being used are beyond the technology limits of the device. The voltages need to be recovered relatively fast especially in cases of brown out in which there is a race against power supply discharging in a matter of microseconds. Ultra-low power parts typically spend very little time in run mode after a deep sleep power down mode to minimize duty cycle. Accordingly, care must be taken in applying and recovering voltages applied to the devices.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of devices and methods disclosed herein include voltage recovery circuitry that boosts a cascoded switch by providing a bias that ramps at the same rate of the voltage that is being recovered, allowing for maximum use of the voltage headroom across the MOSFET gate. The voltage recovery circuitry helps achieve ultra-low power modes even when under-voltage conditions, such as power mode transitions, brown-outs, or power-on reset, occur, by maintaining constant gate-source voltage during the recovery period, thereby preventing damage to gate oxides that may otherwise be subjected to voltages greater than the oxides are designed to handle. The voltage recovery circuitry also helps provide an appropriate level of supply voltage to devices during power mode transitions and power on reset to enable the devices to continue operating during voltage transients.

Figure 1:
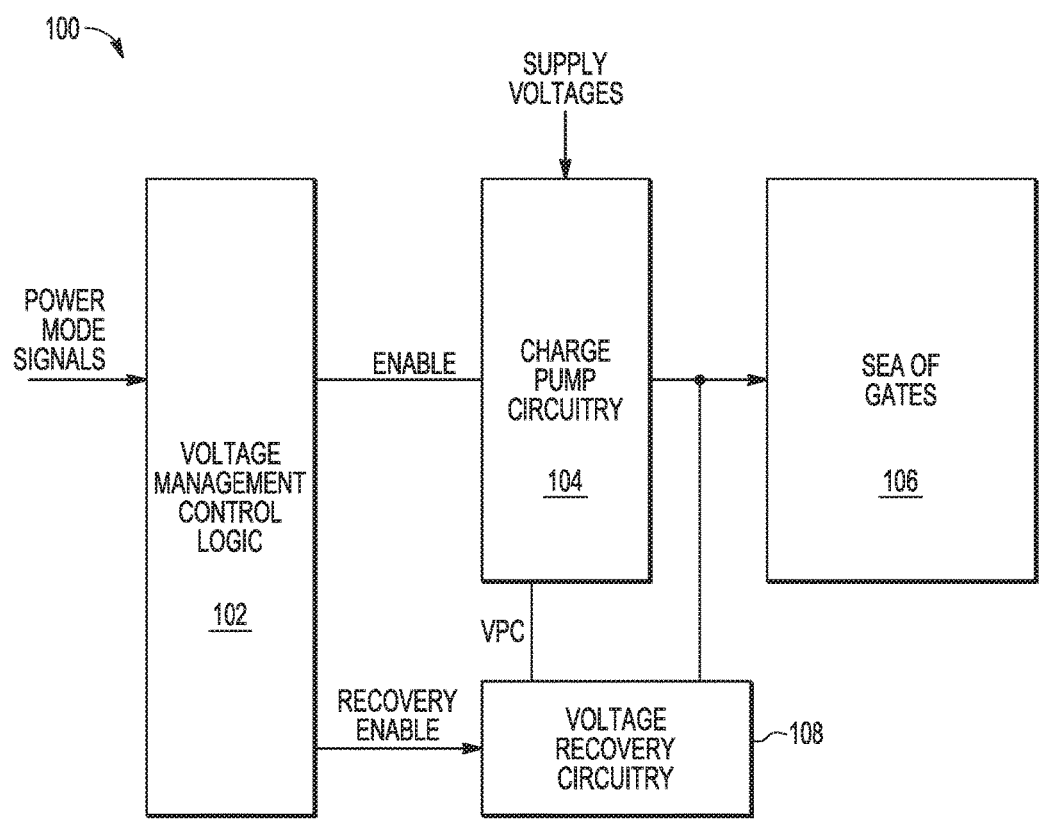
FIG. 1 illustrates a block diagram of an embodiment of a semiconductor device with voltage recovery circuitry in accordance with the present invention.

FIG. 1 illustrates a block diagram of an embodiment of a semiconductor device 100 with voltage recovery circuitry 108 in accordance with the present invention. Semiconductor device 100 includes voltage management control logic 102, charge pump circuitry 104, sea of gates 106, and voltage recovery circuitry 108. Voltage management control logic 102 receives power mode signals from a device controller (not shown) and provides one or more enable signals to charge pump circuitry 104 and the recovery enable signal to voltage recovery circuitry 108 based on the power mode signal. The enable signals to charge pump circuitry 104 can include signals that enable operation of charge pump circuitry 104 during various operational modes, and to indicate when pre-charge voltage (VPC) is to be provided to voltage recovery circuitry 108. Various power modes can used including low, high-speed, and run power modes, among others, with different supply and/or bias voltages being used during each different mode. The recovery enable signal may be asserted when supply voltage is below voltage required for proper operation, and during transient conditions such as power mode transitions, for example, transitioning from low power to run power, or from run power to reset.

Charge pump circuitry 104 receives supply voltages from one or more voltage supplies (not shown) and provides supply voltages to sea of gates 106 based on the enable signal. Charge pump circuitry 104 further provides a pre-charge voltage VPC to voltage recovery circuitry 108. Voltage recovery circuitry 108 has an output coupled to supply voltages provided from charge pump circuitry 104 to sea of gates 106. The output signal from voltage recovery circuitry 104 is adjusted when the recovery enable signal is asserted without creating a voltage at a level that could cause damage to semiconductor devices such as metal oxide field effect transistors (MOSFETs) in sea of gates 106, or the devices used to create or remove the voltage to the sea of gates. Sea of gates 106 can include a system on a chip with a processor and memory circuitry, or a processor or memory circuitry alone, with transistors and/or other devices with wells having a capacitance value coupled to the voltage supplied by charge pump circuitry, as biased by voltage recovery circuitry 108.

Figure 2:
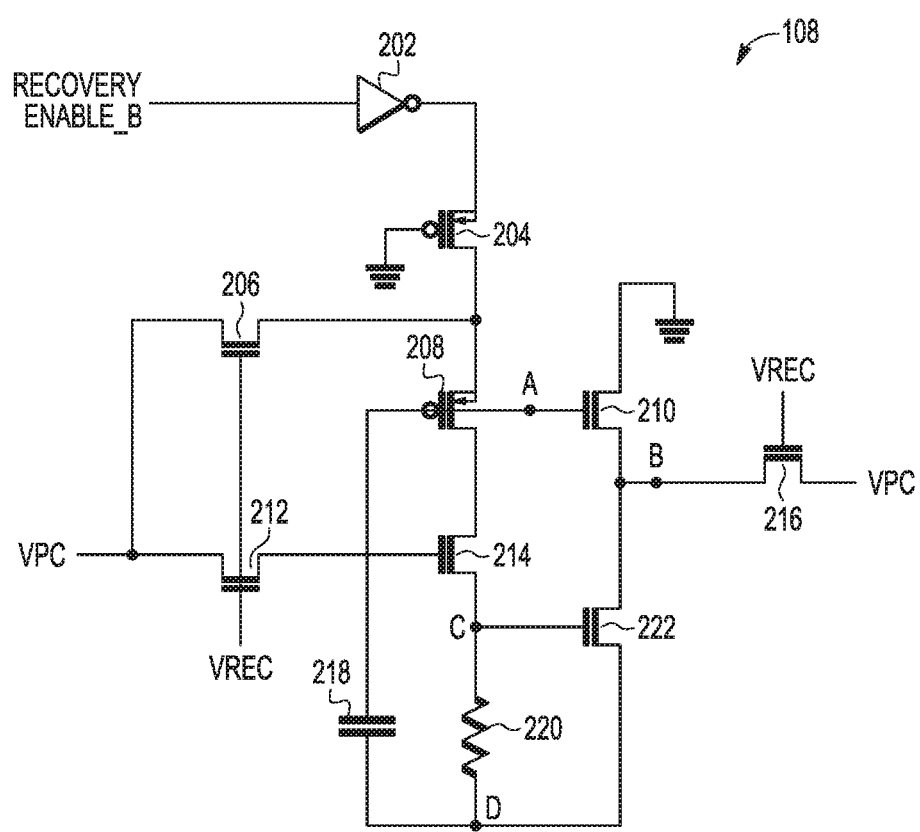
FIG. 2 illustrates a schematic diagram of an embodiment of voltage recovery circuitry that may be used with the semiconductor device in FIG. 1.

FIG. 2 illustrates a schematic diagram of an embodiment of voltage recovery circuitry 108 that may be used with the semiconductor device 100 in FIG. 1 when supply voltages are negative. Voltage recovery circuitry 108 includes inverter 202, P-channel transistors 204, 208, N-channel transistors 206, 210, 212, 214, 216, 222, capacitor 218, and resistive element 220. Inverter 202 has input coupled to receive a complement of the recovery enable signal and an output coupled to a first current electrode of P-channel transistor 204. P-channel transistor 204 further includes a second current electrode coupled to a first current electrode of P-channel transistor 208 and a control electrode coupled to ground.

P-channel transistor 208 further includes a second current electrode coupled to a first current electrode of N-channel transistor 214 and a control electrode coupled to a first terminal of capacitor 218. The control electrode of P-channel transistor 208 is further coupled to node A. A second terminal of capacitor 218 is coupled to node D.

N-channel transistor 206 includes a first current electrode coupled to pre-charge voltage VPC, a second current electrode coupled between the second current electrode of P-channel transistor 204 and the first current electrode of P-channel transistor 208, and a control electrode coupled to control electrode of N-channel transistor 214 and to recovery voltage VREC. N-channel transistor 212 further includes a first current electrode coupled to pre-charge voltage VPC, and a second current electrode coupled to a control electrode of N-channel transistor 214. N-channel transistor 214 further includes a second current electrode coupled to a first terminal of resistive element 220 at node C. A second terminal of resistive element 220 is coupled to node D. Node D is an output of voltage recovery circuit 108.

N-channel transistors 210 and 222 are cascoded with a first current electrode of N-channel transistor 210 coupled to ground, a second current electrode of N-channel transistor 210 coupled to a first current electrode of N-channel transistor 222 at node B, a control electrode of N-channel transistor 210 coupled to node A, a second current electrode of N-channel transistor 222 coupled to node D, and a control electrode of N-channel transistor 222 coupled to node C. N-channel transistor 216 includes a first current electrode coupled to node B, a second current electrode coupled to recovery voltage VREC and a control electrode coupled to a recovery mode voltage VREC or to VPC when recovery mode disabled.

The group including N-channel transistors 208 and 214, resistive element 220, and capacitor 218 are referred to herein as a boot-strap circuit. The group including N-channel transistors 210 and 222 is referred to herein as a cascoded switch circuit.

Figure 3:
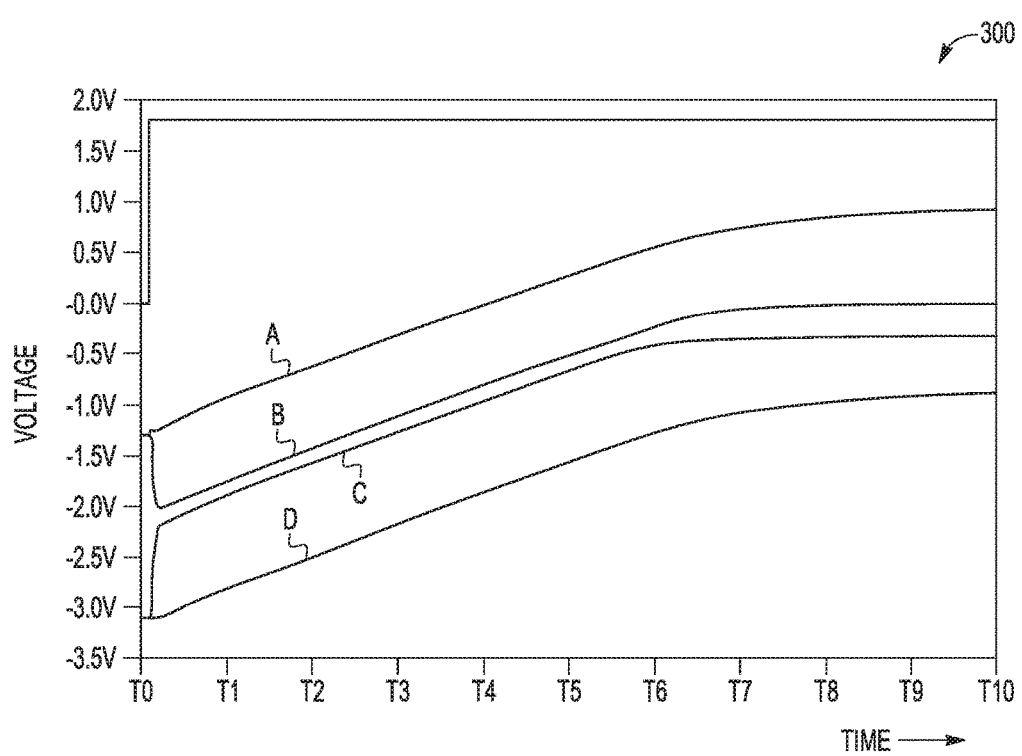
FIG. 3 illustrates a graph of voltage over time at various nodes of the voltage recovery circuitry of FIG. 2.

Referring to FIGS. 2 and 3, FIG. 3 illustrates a graph 300 of voltage over time at various nodes of the voltage recovery circuitry 108 of FIG. 2. Note that the values of voltages shown in FIG. 3 are only examples and that other suitable voltage values may be used. In an initial state at time T0, before the recovery enable signal is asserted, the output of inverter 202 is zero, pre-charge voltage VPC is set to a nominal voltage, such as −1.2 Volts, and recovery voltage VREC is zero. Voltage at nodes A and B is −1.2 Volts, voltage at nodes C and D is −3 Volts. Capacitor 218 is charged at the level of output voltage VROUT.

After the recovery enable signal is asserted, the output of inverter 202 is HIGH and a complement of a recovery voltage VREC_B is applied at the control electrode of transistors 206, 212 and 216. Voltage VREC is supplied at a level sufficient to place transistor 206, 212 in conducting mode without stressing the device. The complement of voltage VREC is supplied at a level that places transistors 206, 212 in non-conducting mode. Cascoded transistors 210, 222 pull up voltage at nodes A, B, C and D. Voltage at node A is pulled up and the voltage at node B is initially pulled down to approximately −1.8 Volts. Voltage at node A is gradually pulled up to approximately 0.8 Volts and voltage at node B is gradually pulled up to approximately −0.5 Volts, over a time period beginning just after time T0 through time T9. Voltage at node C is initially pulled up from −3 Volts to approximately −2.1 Volts and the voltage at node D is at −3.0 Volts. Voltage at node C is gradually pulled up to approximately −0.8 Volts over a time period beginning just after time T0 through time T6 and voltage at node D is gradually pulled up to a value just above −1.0 to 0.5 Volts over a time period beginning just after time T0 through time T9.

The difference in voltages between nodes A and B, and between nodes C and D, remains almost constant over the time period beginning just after time T0 through time T6. The difference in voltage between nodes A and B slightly increases from time T6 through time T9, and the difference in voltage between nodes C and D slightly decreases from time T6 through time T9.

N-channel transistor 214 is configured as a source follower that boosts input to cascoded transistors 210, 222 during under-voltage events. As the output of inverter 202 goes HIGH when recovery is enabled, voltages at nodes A, B, C and D are pulled up to reduce the output bias voltage that is coupled to the supply voltage provided to devices in sea of gates 106. The reduction in negative bias voltage helps maintain voltage provided to devices in sea of gates 106 at a constant level, thereby preventing devices in sea of gates 106 or devices used to generate or remove the voltages from shutting down or being damaged.

Figure 4:
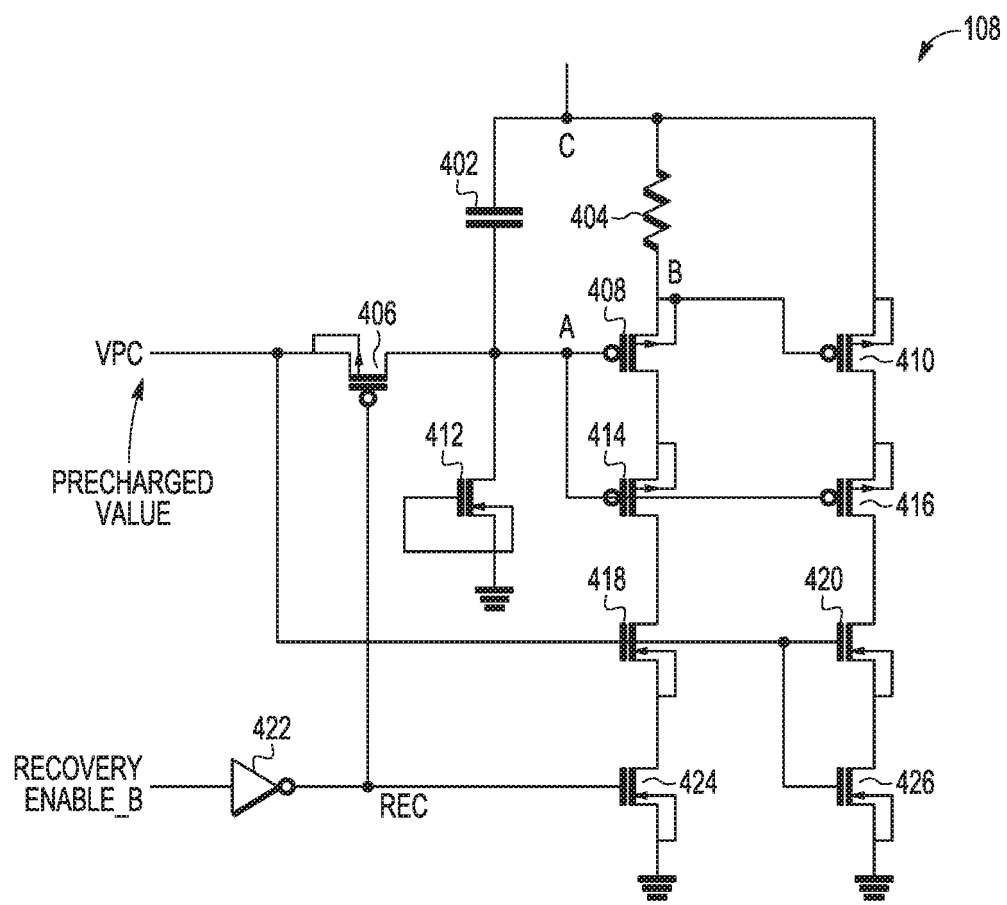
FIG. 4 illustrates a schematic diagram of another embodiment of voltage recovery circuitry that may be used with the semiconductor device in FIG. 1.

FIG. 4 illustrates a schematic diagram of another embodiment of voltage recovery circuitry 108 that may be used with the semiconductor device 100 in FIG. 1 when supply voltages are positive. Voltage recovery circuitry 108 includes capacitor 402, resistive element 404, P-channel transistors 406, 408, 410, 414 and 416, N-channel transistors 412, 418, 420, 424 and 426, and inverter 422.

Capacitor 402 has a first terminal coupled to node C at the output of voltage recovery circuitry 108 and a second terminal coupled to node A.

Resistive element 404 includes a first terminal coupled to node C and a second terminal coupled to node B.

Transistor 406 includes a first current electrode coupled to pre-charge voltage VPC, a second current electrode coupled to node A, and a control electrode coupled to the output of inverter 422, which is coupled to VPC.

Transistor 408 includes a first current electrode coupled to node B, a second current electrode coupled to a first current electrode of transistor 414, and a control electrode coupled to node A.

Transistor 410 includes a first current electrode coupled to node C, a second current electrode coupled to a first current electrode of transistor 416 and a control electrode coupled to node B.

Transistor 412 includes a first current electrode coupled to node A, and a second current electrode coupled to a control electrode of transistor 412.

Transistor 414 further includes a second current electrode coupled to a first current electrode of transistor 418 and a control electrode coupled to node A.

Transistor 416 further includes a second current electrode coupled to a first current electrode of transistor 420 and a control electrode coupled to node A.

Transistor 418 further includes a second current electrode coupled to a first current electrode of transistor 424 and a control electrode coupled to pre-charge voltage VPC.

Transistor 420 further includes a second current electrode coupled to a first current electrode of transistor 426 and a control electrode coupled to pre-charge voltage VPC.

Transistor 424 further includes a second current electrode coupled to ground and a control electrode coupled to an output of inverter 422.

Transistor 426 further includes a second current electrode coupled to ground and a control electrode coupled to pre-charge voltage VPC.

An input to inverter 422 is coupled to a complement of the recovery enable signal and supplied by VPC.

Figure 5:
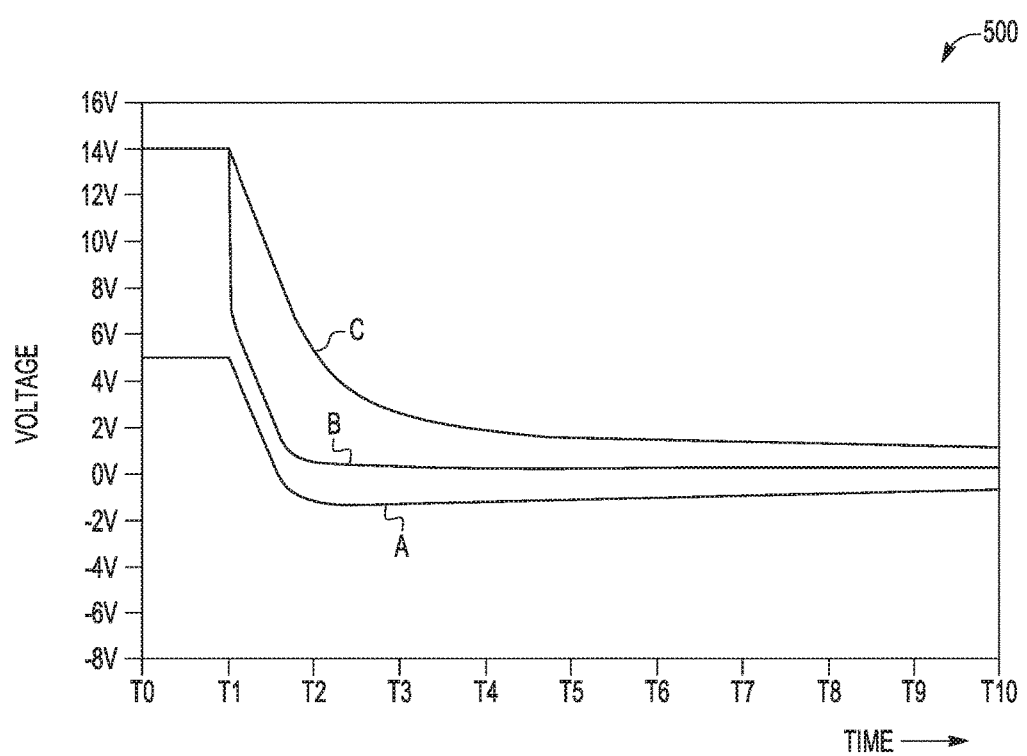
FIG. 5 illustrates a graph of voltage over time at various nodes of the voltage recovery circuitry of FIG. 4.

Referring to FIGS. 4 and 5, FIG. 5 illustrates a graph of voltage over time at nodes A, B and C of the voltage recovery circuitry 108 of FIG. 4. Note that the values of voltages shown in FIG. 5 are only examples and that other suitable voltage values may be used. In an initial state at time T0, before the recovery enable signal is asserted, the output of inverter 422 is zero, pre-charge voltage VPC is set to a nominal voltage, such as 5 Volts, and recovery voltage VREC is 14 Volts. Voltage at nodes B and C is 14 Volts, voltage at node A is 5 Volts. Capacitor 402 is charged at the level of recovery voltage VREC.

After the recovery enable signal is asserted at time T1, voltage at node A decreases exponentially, crossing −1 Volt between times T3 and T4 and decreasing asymptotically to −7 Volts from time T4 to time T10. Voltage at node B decreases linearly to approximately 0.7 Volts between time T1 and time T2, and continues decreasing asymptotically toward 0 Volts from just before time T2 to time T10. Voltage at node C decreases exponentially to 1 Volt from time T1 to time T10.

The difference in voltages between nodes A and B, and between nodes C and D, remains almost constant over the time period beginning just after time T4 through time T10. P-channel transistor 408 is configured as a source follower that provides a bias and limits the swing at the gate of transistor 410 during over-voltage events. Transistor 418 and 424 create a load for source follower transistor 408 to draw current across resistor 404. As the supply voltage is recovering, voltage at node A is boosted by capacitor 402. Voltage at node A follows voltage at node C in terms of transient slew rate, preventing devices in sea of gates 106 (FIG. 1) from shutting down or being damaged. Transistor 412 acts as a clamp to prevent voltage at nodes A and C from decreasing beyond a desired level. Transistors 410, 416, 420, 426 act as a switch to ground.

By now it should be appreciated that in selected embodiments there has been provided a voltage recovery circuit that can comprise a bootstrap circuit including: a first transistor (208, 414) having a first current electrode, a second current electrode, and a control electrode; a second transistor (214, 408) having a first current electrode coupled to the second current electrode of the first transistor, a second current electrode, and a control electrode coupled to the control electrode of the first transistor; a first resistive element (220, 404) having a first terminal coupled to the second current electrode of the second transistor, and a second terminal coupled to an output of the voltage recovery circuit; and a first capacitive element (218, 402) having a first terminal coupled to the control terminals of the first and second transistors and a second terminal coupled to the output of the voltage recovery circuit. A cascode switch circuit can be coupled to the bootstrap circuit. The cascade switch circuit can include a third transistor (210, 416) having a first current electrode coupled to receive a first input voltage (ground), a second current electrode, and a control electrode coupled to the control electrodes of the first and second transistors; and a fourth transistor (222, 410) having a first current electrode coupled to the second current electrode of the third transistor, a second current electrode coupled to the output of the voltage recovery circuit, and a control electrode coupled to the second current electrode of the second transistor and the first terminal of the first resistive element.

In another aspect, the circuit can further comprise a second capacitive element (capacitance node recovered) coupled to the output of the voltage recovery circuit.

In another aspect, the second capacitive element can include one or more wells.

In another aspect, the one or more wells can be located in a memory or sea of gates (SOG).

In another aspect, the second transistor can be configured as a source follower.

In another aspect, the circuit can further comprise a first switch (206) coupled to provide a second input voltage (−1.2V) to the first current electrode of the first transistor, the first switch controlled by a first control signal (vrec); a second switch (212) coupled to provide the second input voltage to the control terminals of the first, second, and third transistors, the second switch controlled by the first control signal; and a third switch (216) coupled to provide the second input voltage to second current electrode of the third transistor and to the first current electrode of the fourth transistor, the third switch controlled by the first control signal.

In another aspect, during a first state (initial state) of the first control signal, the first current electrode of the first transistor, the control terminals of the first, second, and third transistors, and the second current electrode of the third transistor and the first current electrode of the fourth transistor can be pre-charged to a voltage approximately equal to the second input voltage.

In another aspect, the circuit can further comprise a voltage bias circuit (202, 204) coupled to the first current electrode of the first transistor, the voltage bias circuit controlled by a second control signal (recovery_enable_b).

In another aspect, during a first state (recovery) of the second control signal, the voltage bias circuit can provide a bias voltage (1.8V) to the first current electrode of the first transistor.

In another aspect, the first state of the first control signal can correspond to a low power mode and the first state of the second control signal corresponds to a normal mode of operation.

In other selected embodiments, a voltage recovery circuit can comprise a bootstrap circuit including a first transistor (208, 414) having a first current electrode operatively coupled to receive a first input voltage (−1.2V) or a second input voltage (1.8V), a second current electrode, and a control electrode; a second transistor (214, 408) having a first current electrode coupled to the second current electrode of the first transistor, a second current electrode, and a control electrode coupled to the control electrode of the first transistor; a first resistive element (220, 404) having a first terminal coupled to the second current electrode of the second transistor, and a second terminal coupled to an output of the voltage recovery circuit; and a first capacitive element (218, 402) having a first terminal coupled to the control terminals of the first and second transistors and a second terminal coupled to the output of the voltage recovery circuit. A cascode switch circuit can be coupled to the bootstrap circuit, where the cascade switch circuit can include a third transistor (210, 416) having a first current electrode coupled to receive a third input voltage, a second current electrode, and a control electrode coupled to the control electrodes of the first and second transistors, the control electrodes of the first, second, and third transistors operatively coupled to receive the first input voltage; and a fourth transistor (222, 410) having a first current electrode coupled to the second current electrode of the third transistor, a second current electrode coupled to the output of the voltage recovery circuit, and a control electrode coupled to the second current electrode of the second transistor and the first terminal of the first resistive element.

In another aspect, the circuit can further comprise a second capacitive element (capacitance node recovered) coupled to the output of the voltage recovery circuit.

In another aspect, the second capacitive element can have a capacitance value of approximately equal to or greater than 0.5 picoFarads (pF).

In another aspect, the circuit can further comprise a voltage bias circuit (202, 204) coupled to the bootstrap circuit, the voltage bias circuit providing the second input voltage.

In another aspect, the first current electrode of the first transistor can be operatively coupled to receive the first input voltage (−1.2V) during a first mode and operatively coupled to receive the second input voltage (1.8V) during a second mode. The control electrodes of the first, second, and third transistors are operatively coupled to receive the first input voltage during the first mode.

In another aspect, the first mode can be a low power mode and the second mode can be a normal mode of operation.

In another aspect, the first mode can be an erase operation of a non-volatile memory and the second mode can be a read operation of the non-volatile memory.

In another aspect, during the first mode, the first current electrode of the first transistor, the control terminals of the first, second, and third transistors, and the second current electrode of the third transistor and the first current electrode of the fourth transistor are pre-charged to a voltage approximately equal to the first input voltage.

In further selected embodiments, an integrated circuit can comprise a bootstrap circuit including a first transistor (208, 414) having a first current electrode operatively coupled to receive a first input voltage or a second input voltage, a second current electrode, and a control electrode; a second transistor (214, 408) having a first current electrode coupled to the second current electrode of the first transistor, a second current electrode, and a control electrode coupled to the control electrode of the first transistor; a first resistive element (220, 404) having a first terminal coupled to the second current electrode of the second transistor, and a second terminal coupled to an output of the voltage recovery circuit; and a first capacitive element (218, 402) having a first terminal coupled to the control terminals of the first and second transistors and a second terminal coupled to the output of the voltage recovery circuit. A cascode switch circuit can be coupled to the bootstrap circuit, where the cascade switch circuit can include a third transistor (210, 416) having a first current electrode coupled to receive a third input voltage, a second current electrode, and a control electrode coupled to the control electrodes of the first and second transistors, the control electrodes of the first, second, and third transistors operatively coupled to receive the first input voltage; and a fourth transistor (222, 410) having a first current electrode coupled to the second current electrode of the third transistor, a second current electrode coupled to the output of the voltage recovery circuit, and a control electrode coupled to the second current electrode of the second transistor and the first terminal of the first resistive element. A voltage bias circuit (202, 204) can be coupled to the bootstrap circuit, where the voltage bias circuit providing the second input voltage.

In another aspect, the first transistor can be a PMOS transistor and the second, third, and fourth transistors can be NMOS transistors (FIG. 2).

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A voltage recovery circuit comprising:
   a bootstrap circuit including:
      a first transistor having a first current electrode, a second current electrode, and a control electrode;
      a second transistor having a first current electrode coupled to the second current electrode of the first transistor, a second current electrode, and a control electrode coupled to the control electrode of the first transistor;
      a first resistive element having a first terminal coupled to the second current electrode of the second transistor, and a second terminal coupled to an output of the voltage recovery circuit; and
      a first capacitive element having a first terminal coupled to the control terminals of the first and second transistors and a second terminal coupled to the output of the voltage recovery circuit;
   a cascode switch circuit coupled to the bootstrap circuit, the cascade switch circuit including:
      a third transistor having a first current electrode coupled to receive a first input voltage, a second current electrode, and a control electrode coupled to the control electrodes of the first and second transistors; and
      a fourth transistor having a first current electrode coupled to the second current electrode of the third transistor, a second current electrode coupled to the output of the voltage recovery circuit, and a control electrode coupled to the second current electrode of the second transistor and the first terminal of the first resistive element.

2. The circuit of claim 1, further comprising a second capacitive element coupled to the output of the voltage recovery circuit.

3. The circuit of claim 2, wherein the second capacitive element includes one or more wells.

4. The circuit of claim 3, wherein the one or more wells are located in a memory or sea of gates (SOG).

5. The circuit of claim 1, wherein the second transistor is configured as a source follower.

6. The circuit of claim 1, further comprising:
a first switch coupled to provide a second input voltage to the first current electrode of the first transistor, the first switch controlled by a first control signal;
a second switch coupled to provide the second input voltage to the control terminals of the first, second, and third transistors, the second switch controlled by the first control signal; and
a third switch coupled to provide the second input voltage to second current electrode of the third transistor and to the first current electrode of the fourth transistor, the third switch controlled by the first control signal.

7. The circuit of claim 6, wherein during a first state of the first control signal, the first current electrode of the first transistor, the control terminals of the first, second, and third transistors, and the second current electrode of the third transistor and the first current electrode of the fourth transistor are pre-charged to a voltage approximately equal to the second input voltage.

8. The circuit of claim 1, further comprising a voltage bias circuit coupled to the first current electrode of the first transistor, the voltage bias circuit controlled by a second control signal.

9. The circuit of claim 8, wherein during a first state of the second control signal, the voltage bias circuit provides a bias voltage to the first current electrode of the first transistor.

10. The circuit of claim 9, wherein the first state of the first control signal corresponds to a low power mode and the first state of the second control signal corresponds to a normal mode of operation.

11. A voltage recovery circuit comprising:
a bootstrap circuit including:
a first transistor having a first current electrode operatively coupled to receive a first input voltage or a second input voltage, a second current electrode, and a control electrode;
a second transistor having a first current electrode coupled to the second current electrode of the first transistor, a second current electrode, and a control electrode coupled to the control electrode of the first transistor;
a first resistive element having a first terminal coupled to the second current electrode of the second transistor, and a second terminal coupled to an output of the voltage recovery circuit; and
a first capacitive element having a first terminal coupled to the control terminals of the first and second transistors and a second terminal coupled to the output of the voltage recovery circuit;
a cascode switch circuit coupled to the bootstrap circuit, the cascade switch circuit including:
a third transistor having a first current electrode coupled to receive a third input voltage, a second current electrode, and a control electrode coupled to the control electrodes of the first and second transistors, the control electrodes of the first, second, and third transistors operatively coupled to receive the first input voltage; and
a fourth transistor having a first current electrode coupled to the second current electrode of the third transistor, a second current electrode coupled to the output of the voltage recovery circuit, and a control electrode coupled to the second current electrode of the second transistor and the first terminal of the first resistive element.

12. The circuit of claim 11, further comprising a second capacitive element coupled to the output of the voltage recovery circuit.

13. The circuit of claim 12, wherein the second capacitive element has a capacitance value of approximately equal to or greater than 0.5 picoFarads (pF).

14. The circuit of claim 11, further comprising a voltage bias circuit coupled to the bootstrap circuit, the voltage bias circuit providing the second input voltage.

15. The circuit of claim 11, wherein first current electrode of the first transistor is operatively coupled to receive the first input voltage during a first mode and operatively coupled to receive the second input voltage during a second mode, and wherein the control electrodes of the first, second, and third transistors are operatively coupled to receive the first input voltage during the first mode.

16. The circuit of claim 15, wherein the first mode is a low power mode and the second mode is a normal mode of operation.

17. The circuit of claim 15, wherein the first mode is an erase operation of a non-volatile memory and the second mode is a read operation of the non-volatile memory.

18. The circuit of claim 15, wherein during the first mode, the first current electrode of the first transistor, the control terminals of the first, second, and third transistors, and the second current electrode of the third transistor and the first current electrode of the fourth transistor are pre-charged to a voltage approximately equal to the first input voltage.

19. An integrated circuit comprising:
a bootstrap circuit including:
a first transistor having a first current electrode operatively coupled to receive a first input voltage or a second input voltage, a second current electrode, and a control electrode;
a second transistor having a first current electrode coupled to the second current electrode of the first transistor, a second current electrode, and a control electrode coupled to the control electrode of the first transistor;
a first resistive element having a first terminal coupled to the second current electrode of the second transistor, and a second terminal coupled to an output of the voltage recovery circuit; and
a first capacitive element having a first terminal coupled to the control terminals of the first and second transistors and a second terminal coupled to the output of the voltage recovery circuit;
a cascode switch circuit coupled to the bootstrap circuit, the cascade switch circuit including:
a third transistor having a first current electrode coupled to receive a third input voltage, a second current electrode, and a control electrode coupled to the control electrodes of the first and second transistors, the control electrodes of the first, second, and third transistors operatively coupled to receive the first input voltage; and
a fourth transistor having a first current electrode coupled to the second current electrode of the third transistor, a second current electrode coupled to the output of the voltage recovery circuit, and a control electrode coupled to the second current electrode of the second transistor and the first terminal of the first resistive element; and
a voltage bias circuit coupled to the bootstrap circuit, the voltage bias circuit providing the second input voltage.

20. The circuit of claim 19, wherein the first transistor is a PMOS transistor and the second, third, and fourth transistors are NMOS transistors.

* * * * *